United States Patent [19]
Eckert et al.

[11] Patent Number: 5,889,303
[45] Date of Patent: Mar. 30, 1999

[54] SPLIT-CONTROL GATE ELECTRICALLY ERASABLE PROGRAMMABLE READ ONLY MEMORY (EEPROM) CELL

[75] Inventors: Kim Hunter Eckert, Austin; Craig Cavins, Pflugerville, both of Tex.

[73] Assignee: Motorola, Inc., Schaumburg, Ill.

[21] Appl. No.: 835,166

[22] Filed: Apr. 7, 1997

[51] Int. Cl.⁶ .................................................. H01L 29/788
[52] U.S. Cl. ......................... 257/316; 257/299; 257/315; 257/321
[58] Field of Search ..................... 257/315, 316, 257/317, 319, 320, 321; 365/185.01, 185.11, 185.12–185.16

[56] References Cited

U.S. PATENT DOCUMENTS

| | | | |
|---|---|---|---|
| 4,274,012 | 6/1981 | Simko | 257/319 |
| 4,630,087 | 12/1986 | Momodomi | 357/23.5 |
| 5,304,503 | 4/1994 | Yoon et al. | 437/43 |
| 5,480,820 | 1/1996 | Roth et al. | 437/43 |
| 5,512,505 | 4/1996 | Yuan et al. | 437/43 |
| 5,612,913 | 3/1997 | Cappelletti et al. | 360/185.12 |
| 5,668,757 | 9/1997 | Jeng | 257/319 |

OTHER PUBLICATIONS

Tadashi Shibata et al., "An Intelligent MOS Transistor Featuring Gate–Level Weighted Sum and Threshold Operations", IEDM 1991, pp. 919–922.

*Primary Examiner*—Sara Crane
*Attorney, Agent, or Firm*—Keith E. Witek

[57] ABSTRACT

An EEPROM cell (32) is formed having a vertical select gate (34) and a horizontal select gate (40). The vertical select gate (34) and the horizontal select gate (40) enable two dimensional decoding which selects which one or which plurality of memory cells (32) are enabled for program, erase and read operations. An additional select gate having a control electrode (44) can be added to the cell (32) to provide additional decoding as is necessary. This split gate EEPROM cell (32) can be readily integrated onto an integrated circuit which also contains flash memory (204). The flash memory (204) and the split control gate EEPROM array (202) can share the same common charge pumps circuit (208).

8 Claims, 6 Drawing Sheets

SPLIT-CONTROL GATE ELECTRICALLY ERASABLE PROGRAMMABLE READ ONLY MEMORY (EEPROM) CELL

FIELD OF THE INVENTION

The present invention relates generally to integrated circuit manufacturing, and more particularly to, a method for forming a electrically erasable programmable read only memory cell (EEPROM).

BACKGROUND OF THE INVENTION

FIG. 1 illustrates a conventional EEPROM memory array. A section 10 of eight EEPROM cells is illustrated in detail. Conventional EEPROM memory cells have a byte select transistor 12 as illustrated in FIG. 1 which selects or de-selects eight EEPROM cells at a time. Each EEPROM cell of the eight EEPROM cells in section 10 have a single drain select transistor 14 and a single floating gate transistor 16. Therefore, the detailed illustration of section 10 in FIG. 1 contains eight drain select transistors 14 which are respectively coupled serially to eight floating gate transistors 16 to make eight EEPROM cells. The drain electrodes of the drain select transistors 14 are coupled to bit lines 20 as illustrated in FIG. 1. The source electrodes of the floating gate transistor 16 are all coupled together to a common source 22 as illustrated in FIG. 1. Vertical and horizontal selection of memory cells is performed respectively using the vertical select 18 and the horizontal select 24. Both the vertical select 18 and the horizontal select 24 are coupled to the byte select transistor 12.

The conventional EEPROM device of FIG. 1 requires extremely high drain voltages in order to properly operate. Specifically, drain voltages applied through the transistors 14 to the floating transistors 16 are typically on the order of 10–16 volts in order to enable EEPROM tunneling effects. In order to properly handle this large voltage and the higher electric fields/currents associated with this larger voltage range, the drain select transistors 14 are specially-designed high voltage transistors which are very difficult to manufacture along with lower voltage logic transistors which are integrated on the same integrated circuit (IC) substrate. Therefore, the conventional EEPROM of FIG. 1 is disadvantageous in that the transistors 14 must be specialized high voltage transistors and that these high voltage transistors must be integrated with other lower voltage transistors on a single substrate which often results in reduced yield.

In addition, the circuit of FIG. 1 contains seventeen transistors in order to store eight bits of information. Due to the use of seventeen transistors, a conventional EEPROM cell as illustrated in FIG. 1 will have a very large surface area compared to alternative solutions.

One other prior art device which is of interest contains multiple control gates, but does not use tunneling in order to store a logic value. This structure is referred to as a neuron MOSFET. A neuron MOSFET is a multi-control electrode device which operates based on capacitive coupling and does not use electron tunneling or hot carrier injection (HCI) of electrons into a floating gate in order to store a logic value. Instead, a neuron MOSFET is more like a conventional logic gate, and less like an EPROM or EEPROM cell, in that the neuron MOSFET is not a non-volatile structure but a structure that losses logic state when power is removed from the control gates. Therefore, a neuron MOSFET does not require a program and erase cycles and will not store a logic bit value in a non-volatile manner similar to conventional EEPROM cells.

Therefore, a new transistor structure which is non-volatile in nature and: (1) has a reduced surface area; (2) has a lower drain voltage to reduce gate oxide stress; and (4) has no need for high voltage transistors in the memory array which have been shown to reduce conventional yield, is needed in the IC industry.

DETAILED DESCRIPTION OF THE DRAWINGS

Figure 1:
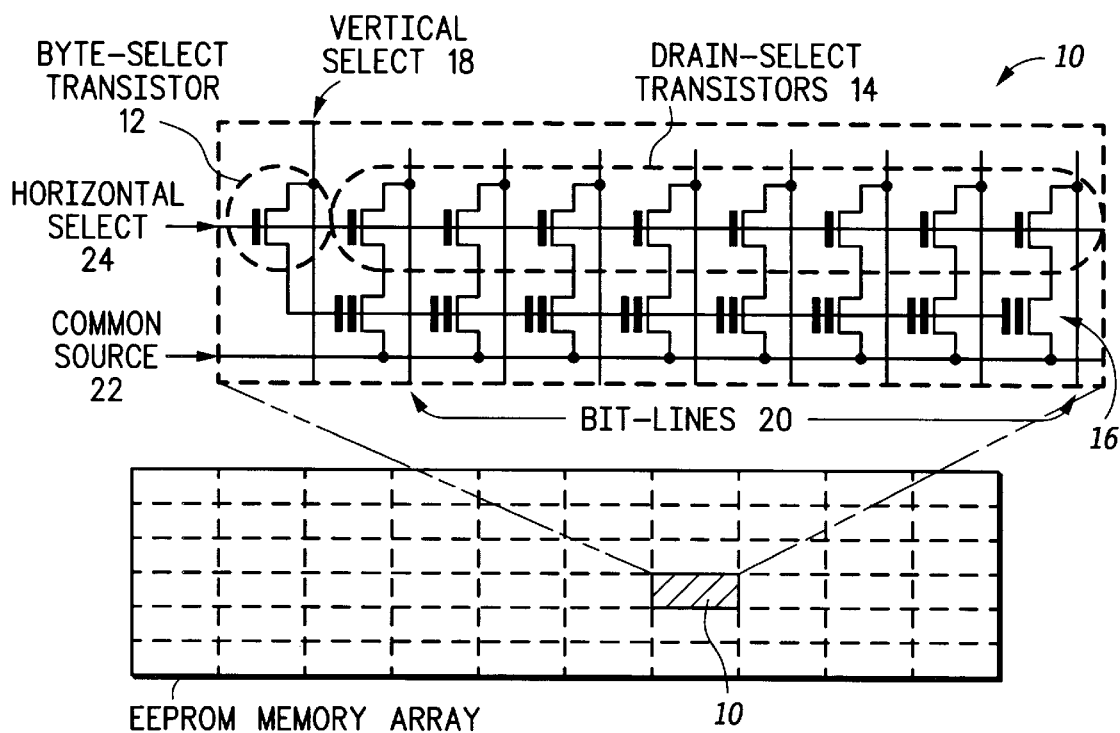
FIG. 1 illustrates, in a circuit schematic, a conventional EEPROM memory cell which is known in the prior art.

Generally, the present invention is an electrically erasable, programmable, read only memory (EEPROM) bit cell. This bit cell utilizes two controlled gate electrodes (i.e., a split control gate (SCG) configuration) instead of the single control gate electrodes used in conventional EEPROM cells as illustrated in FIG. 1. This new cell does not require drain select transistors or byte select transistors as illustrated in FIG. 1 herein. Therefore, the device taught herein is able to achieve smaller surface areas than conventional EEPROM cells. In addition, no high voltage drain select transistors are required, thereby improving yield over prior art devices discussed herein. In addition, the two/split control gate electrodes of the cell taught herein reduces high-voltage-induced gate oxide stress which occurs in conventional EEPROM cells when performing program and erase operations. In essence, the drain lines of the transistor are not required to perform two dimensional (2-D) EEPROM array decoding since one control gate of the cell taught herein is used for horizontal 2-D selection and the other control gate electrode gate taught herein is used for vertical 2-D selection. By using a split control gate to perform two dimensional vertical and horizontal decoding, the EEPROM cell will experience less gate oxide stress than using a drain electrode in the program/erase decode process.

In the EEPROM cell taught herein, the drain voltage of the cell taught herein is never elevated above $V_{DD}$ (as illustrated in TABLE 1 hereinbelow) which is typically five volts or less. This allows low voltage transistors to be used in column select circuitry, thereby improving yield and reducing complexity. This also reduces loss of charge due to transistor drain stress. The EEPROM program and erase operations are done with two dimensional decoding performed at the control gate level and not as a combination of a control gate voltage and a drain voltages. This separates high voltage program and erase signals from the read operational signals. The EEPROM cells taught herein can be bulk erased, block erased, or bit erased provided surrounding control logic supports these type of accesses.

In addition, the EEPROM process taught herein is process and voltage compatible with common flash memory cells. Therefore, the EEPROM cell taught herein can be readily integrated on-chip with flash memory arrays. In addition, since the program and erase voltages of the memory cell taught herein are compatible with flash EEPROM voltages, the memory cell taught herein and flash memory array which are integrated onto a single substrate can share a single charge pump circuit to provide both flash and split-control-gate (SCG) EEPROM program and erase voltages. The use of single charge pump versus two separate charge pumps will significantly save silicon surface area over the prior art since the charge pumps currently used in the industry consumes significant substrate surface area. In the prior art, when both EEPROM and flash memory were integrated onto a single chip, two separate charge pump circuits were needed due to voltage level incompatibilities.

The SCG EEPROM taught herein is easy to implement in a bit-wise format and there is no need for physical byte, block, or bit-wise partitioning in the array which saves space over conventional EEPROM devices which add transistors in the array to select bytes, blocks, etc.

This invention can be further understood with reference to FIGS. 1 through 12.

Figure 2:
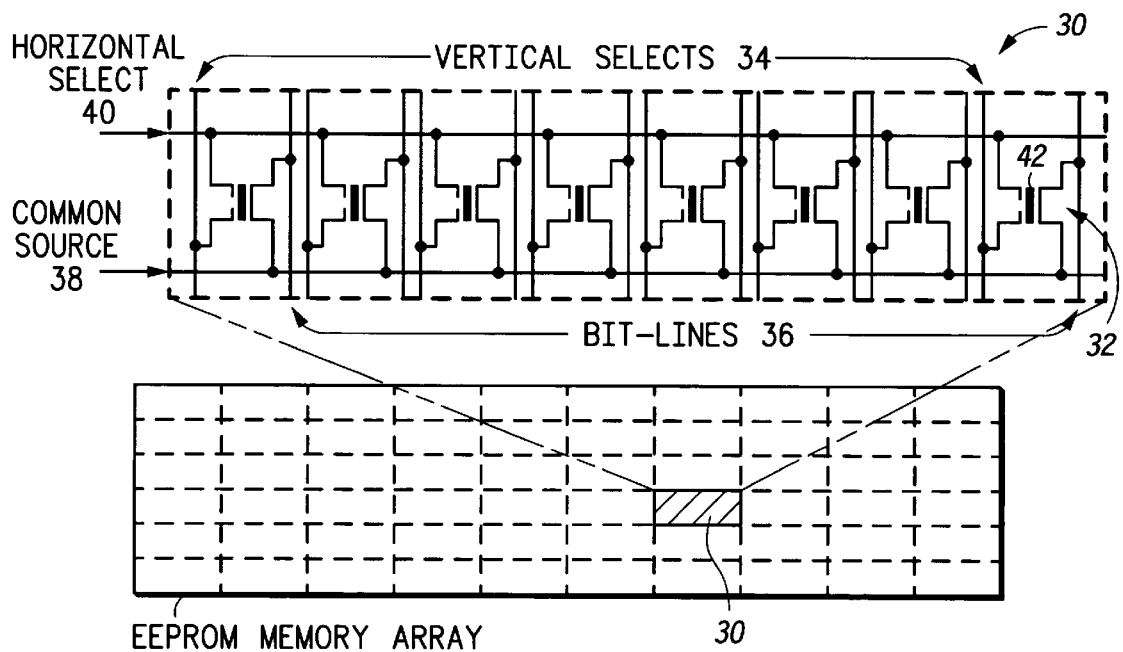
FIG. 2 illustrates, in a circuit schematic, a EEPROM cell configuration in accordance with the present invention.

FIG. 2 illustrates an EEPROM memory array having a memory portion 30. The memory portion 30 is magnified in a circuit schematic in a top portion of FIG. 2 to illustrate the specific circuit configuration of the memory portion 30. Portion 30 contains eight single transistor EEPROM devices 32. Each of the EEPROM devices 32 have a drain electrode coupled to bit lines 36 in FIG. 2. Each of the EEPROM cells 32 have a source electrode coupled to a common source 38 in FIG. 2. A channel region (not labeled numerically in FIG. 2) lies between the drain and source electrodes of floating gate transistors 32. Overlying these channel regions are positioned a floating gate 42 as illustrated. Two-dimensional (2-D) decoding of the memory array of FIG. 2 is performed by utilizing vertical selects 34 and horizontal selects 40. The vertical selects 34 couple to a first control gate adjacent and/or overlying the floating gates 42 of respective transistors 32. The horizontal selects 40 couple to a second control gate located adjacent and/or overlying the floating gate 42 for the respective floating gate transistors 32 as illustrated in FIG. 2. Individual bits or byte portions of the EEPROM memory array are selected in a two dimensional manner via voltages placed on the horizontal selects 40 and the vertical selects 34.

The device in FIG. 2 will operate under certain conditions which are either advantageous or required for EEPROM devices. It is assumed that approximately 11.0 volts are required across a 90 angstrom tunnel oxide in order to adequately generate tunneling current great enough to result in reasonable program and erase times for the cells 32 of FIG. 2. Also, it is desirable if a byte-erasable EEPROM is able to be programmed and erased at least $10^5$ times without failure. Failures are typically due to oxide damage, trapped charge in an oxide, or loss of cell charge via leakage current over time. Typically, the tunneling current through a cell 32 is reduced by an order of magnitude for each volt of reduction across the tunnel oxide.

Figure 3:
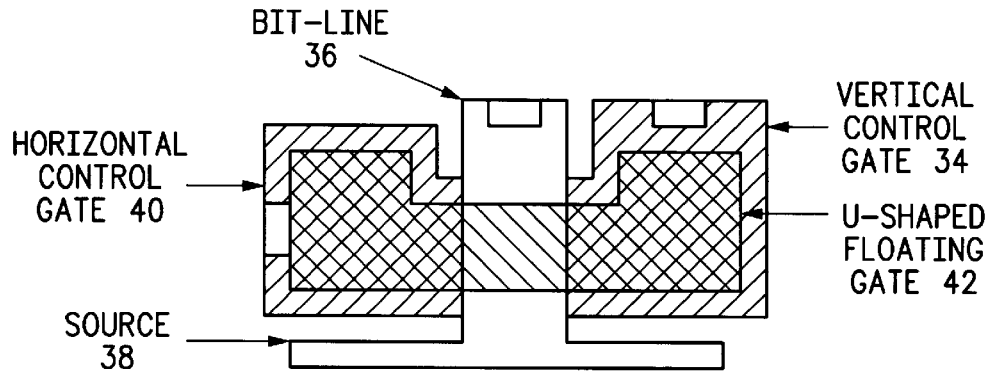
FIG. 3 illustrates, in a top perspective view, a layout of a EEPROM cell having two control gate electrodes in accordance with the present invention.

FIG. 3 illustrates, in top perspective view, a layout of a single cell 32 from FIG. 2. FIG. 3 illustrates the segmented vertical control gate 34 which is equivalent to the control gate coupled to the vertical selects 34 of FIG. 2. FIG. 3 also illustrates the segmented horizontal control gate 40 which is equivalent to the control gate of FIG. 2 which is coupled to the a horizontal select 40. Both the vertical control gate 32 and the horizontal control gate 40 are formed by lithographic patterning and etching of a layer of polysilicon or amorphous silicon. This layer of polysilicon used to form the gates 34 and 40 is typically the second level of polysilicon within the integration. A first layer of polysilicon is typically used to form the U-shaped floating gate 42 as illustrated in FIG. 3. Polysilicon layers herein may be optionally silicided or salicided. Underlying a middle portion of the U-shaped floating gate 42 is a channel region which separates a common source electrode 38 and a substrate-doped drain electrode which is coupled to bit line 36. The drain electrode coupled to the bit line 36 and the source region 38 are typically formed within the substrate via ion implanting of dopant atoms or a like dopant operation in a self-aligned manner. As can be seen from FIG. 3, an extremely small footprint or surface area is consumed by the split-control-gate EEPROM cells 32 of FIG. 2.

Figure 4:
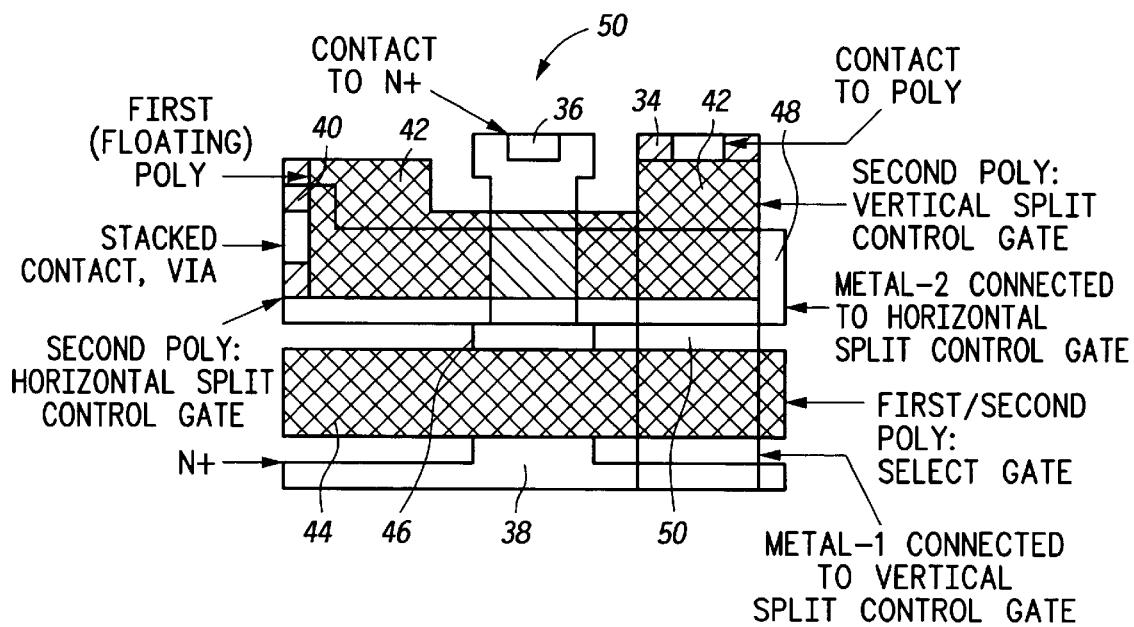
FIG. 4 illustrates, in a top perspective view, a layout of a EEPROM cell having a floating gate transistor with two control gate electrodes and a select gate transistor in accordance with the present invention.

FIG. 4 illustrates a two-transistor EEPROM configuration wherein a top transistor of FIG. 4 is the same structure of FIG. 3. FIG. 4 illustrates that the single transistor structure of FIG. 3, which is also illustrated in FIG. 2, may be formed with an additional select gate 44 (i.e., an additional source-connected transistor) which allows for the source region 38 to be selectively decoupled from the transistor of FIG. 3. This decoupling of the source 38 from the floating gate transistor which is located in a top portion of FIG. 4 is advantageous. When one cell is being read or programmed in a single-transistor cell, other adjacent cells will leak current onto the source 38 thereby affecting reading or programming operations. While these leakage currents can be compensated for algorithmically, some embodiments may chose to avoid this problem entirely by using a two-transistor cell of FIG. 4. The decoupling available when using a two-transistor cell will selectively prevent the floating gate transistor (on a top portion of FIG. 4) from having a bit line 36 to source 38 connection when other EEPROM array cells are being read or programmed to reduce/eliminate source leakage to simplify reading or programming of the bit cell by eliminating the need for algorithmic correction. Also, the transistor using the gate 44 need not be serially coupled to the source as in FIG. 4 but may also be coupled in series with the drain of the floating gate transistor while effectively serving the same basic leakage-limiting function.

Figure 5:
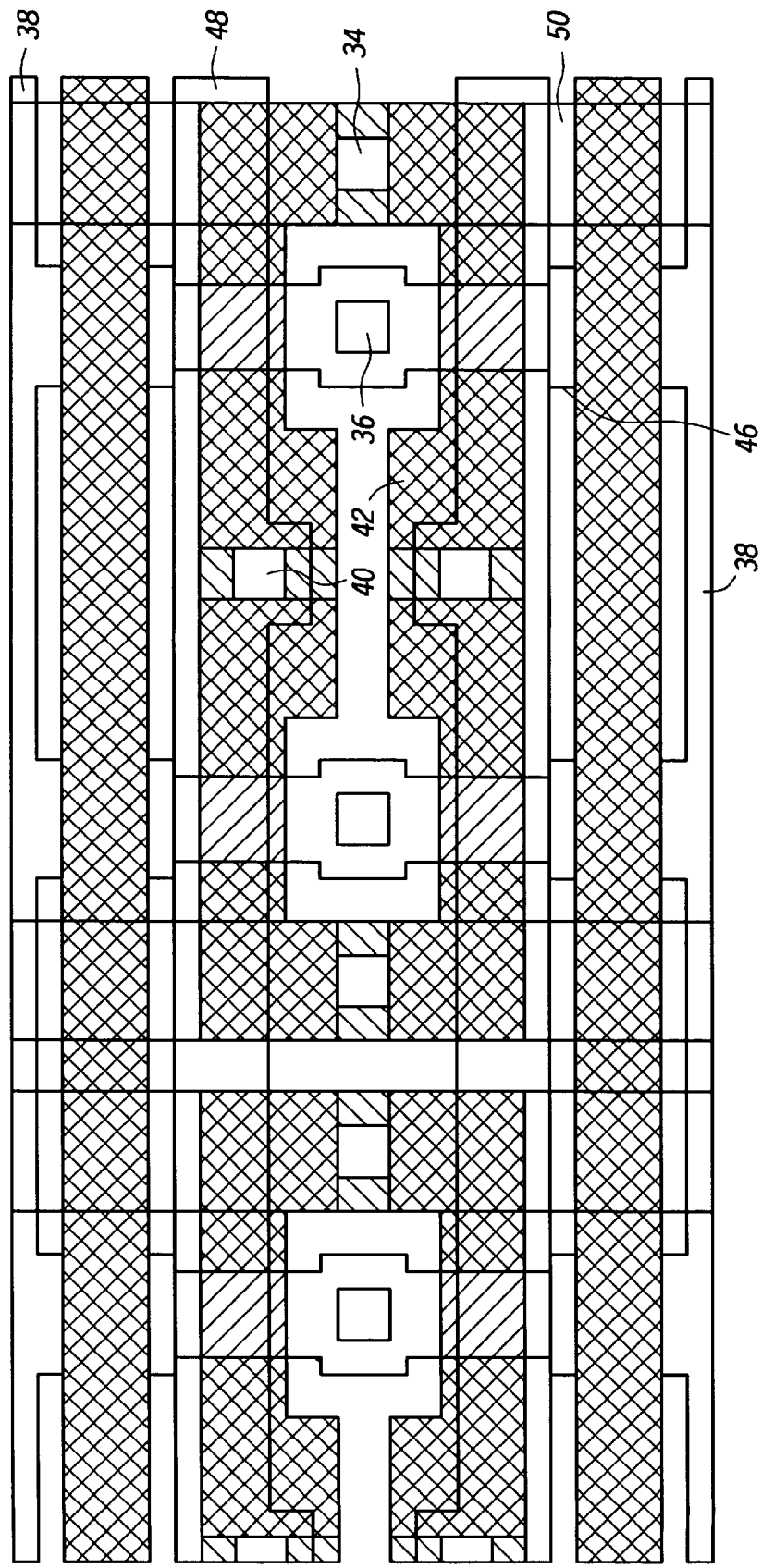
FIG. 5 illustrates, in a top perspective view, the layout of FIG. 4 when a plurality of EEPROM cells are formed in accordance with the present invention.

FIG. 5 illustrates how the layout of FIG. 4 is used to configure a plurality of EEPROM cells into an EEPROM array in accordance with the present invention. As is clearly apparent from FIG. 5, the typical mirror image layout configuration or cell folding used for conventional EEPROM cells can also be utilized when forming memory arrays containing the split-control-gate EEPROM cells taught herein.

Figure 6:
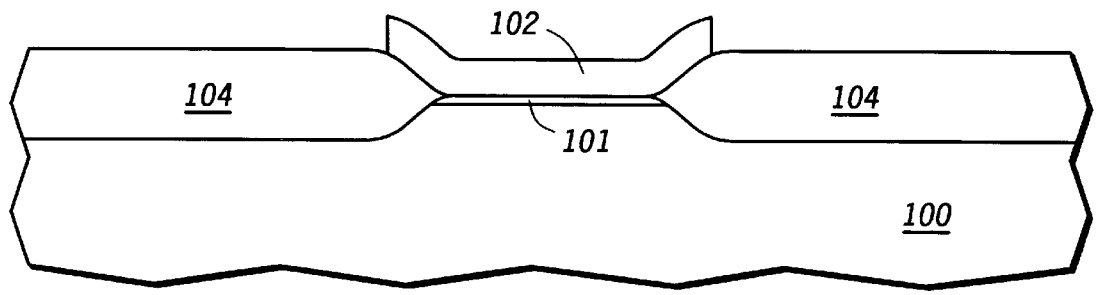
FIGS. 6 through 10 illustrate, in cross-sectional diagrams, a process which can be used to form the dual control gate EEPROM cell in accordance with the present invention.

FIGS. 6 through 10 illustrate, in cross-sectional diagrams, a method for forming the split-control-gate EEPROM cell taught herein. FIG. 6 illustrates that a substrate 100 is provided. Substrate 100 is any semiconductor substrate or silicon-on-insulator (SOI) substrate which can be used to form integrated circuit (IC) devices. A pad thermal oxide 101 is formed overlying the substrate 100. On top of the pad thermal oxide 101 is formed a thin layer of silicon nitride 102. The silicon nitride is lithographically patterned and etch to define active areas of the integrated circuit which will subsequently contain active devices such as transistors and memory cells. All areas not covered by the silicon nitride layer 102 are exposed to a thermal oxidation process to form a field oxide region 104 as illustrated in FIG. 6. It should be apparent that the field oxide illustrated in FIG. 6 may be replaced with trench isolation or like isolation schemes.

Figure 7:
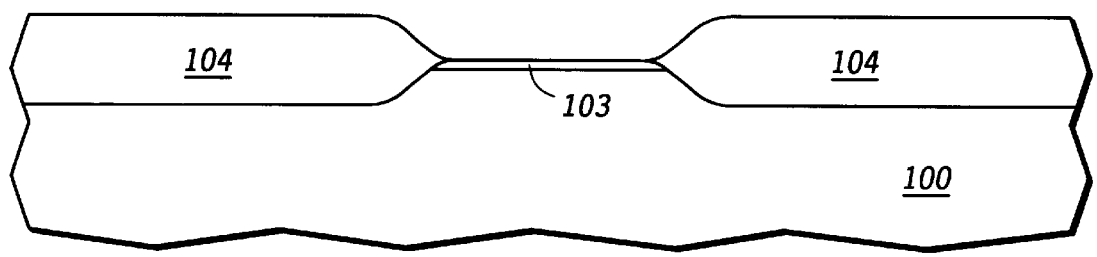

In FIG. 7, the silicon nitride layer 102 and the oxide layer 101 are typically stripped from the wafer and a gate oxide layer 103 is grown. For the EEPROM cells taught herein, the layer 103 will be a tunnel oxide layer through which EEPROM tunneling will occur. This tunneling will provide electrons to and from a floating gate to program and erase the non-volatile EEPROM cells taught in FIGS. 2 through 5 herein. Typically, the tunnel oxide 103 is less than 100 angstroms in thickness, and in a few circumstances, the tunnel gate oxide 103 can be formed of a composite oxide material or can be exposed to nitrogen and/or fluorine to form an oxide interface which contains one or more of nitrogen or fluorine atoms.

Figure 8:
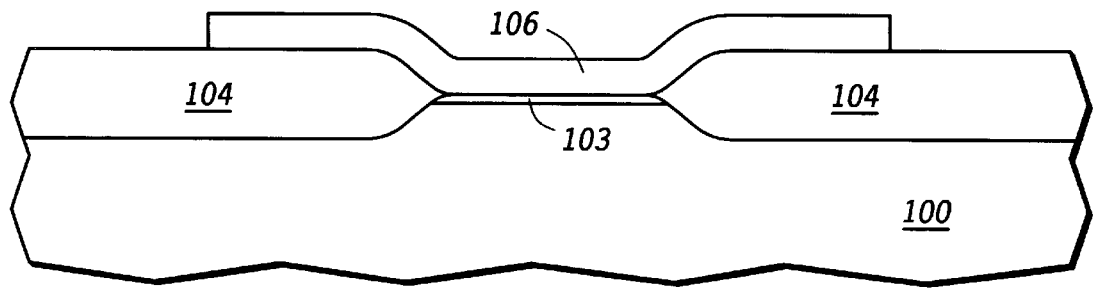

After formation of the tunnel oxide 103, FIG. 8 illustrates that a first layer of polysilicon or amorphous silicon is deposited. This first layer of polysilicon or amorphous silicon is lithographically patterned and etched to form a topographically-U-shaped floating gate 106 as illustrated in FIGS. 3 through 4. It is important to note that other layout gate shapes other than a U-shaped floating gate configuration are possible.

Figure 9:
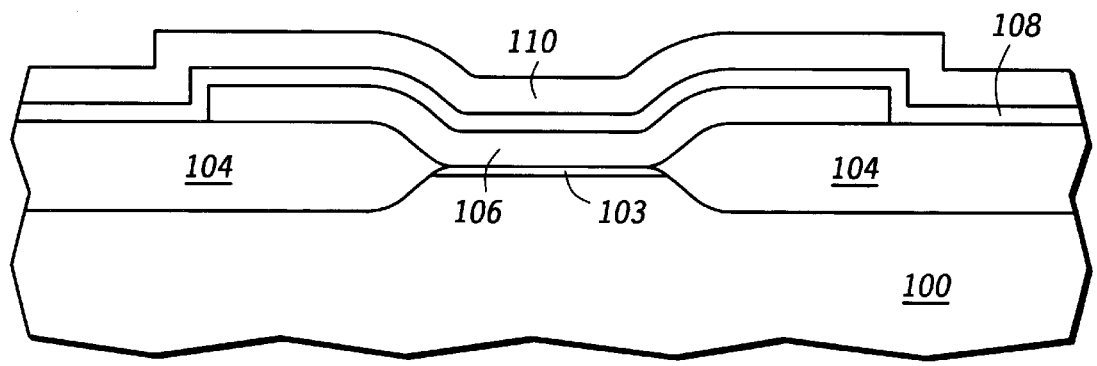

FIG. 9 illustrates that inter-level dielectric 108 is deposited overlying the floating gate 106. The dielectric layer 108 is typically an oxide-nitride-oxide layer (ONO). The layer 108 is typically less than few hundred angstroms in thickness. After formation of layer 108, a second layer of polysilicon 110 is formed overlying the dielectric 108.

Figure 10:
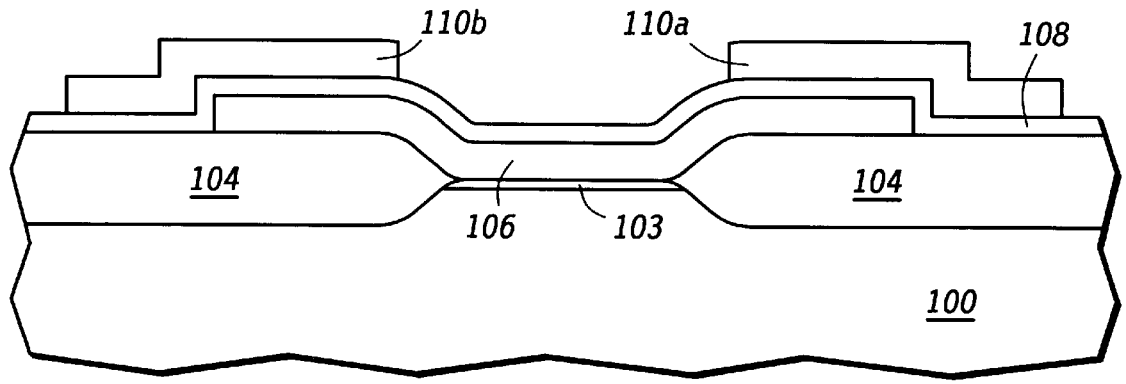

FIG. 10 illustrates that the layer 110 is lithographically patterned and etched to form a horizontal control gate select electrode 110b and a vertical horizontal select electrode 110a in a manner similar to that illustrated in a topographical manner in FIGS. 3 through 4. Typically, the control electrodes 110b and 110a have a coupling ratio to the floating gate 106 of less than 0.5. The coupling between the control gate electrode 110b and the floating gate electrode 106 is roughly 0.4 while the coupling between the control gate electrode 110a and the floating gate 106 is roughly 0.4. If only one gate electrode is selected in FIG. 10, only a coupling ratio of roughly 0.4 is activated between the floating gate and the control gates 110b and 110a. Therefore, only when both control gates 110b and 110a are activated is the entire coupling ratio of 0.8 in effect for the device of FIG. 10. This addition (e.g., 0.4+0.4=0.8 coupling) of coupling ratio is the manner by which two-dimensional (2-D) decoding is performed using the control gates 110b and 110a of FIG. 10.

Figure 11:
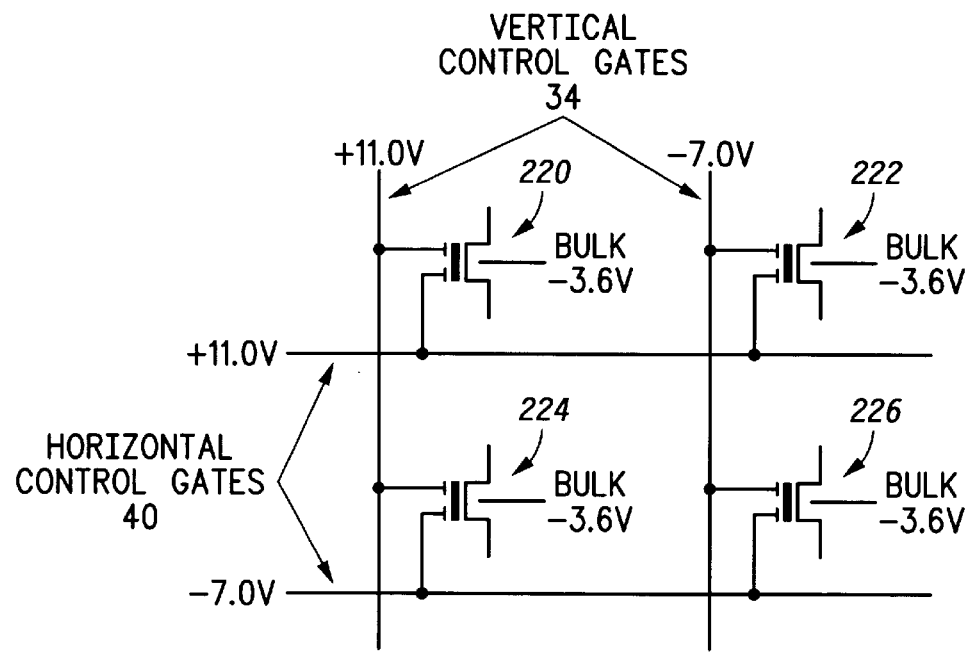
FIG. 11 illustrates, in a circuit schematic, the selected and unselected memory cells which occur during cell erase operations in accordance with the present invention.

FIG. 11 and TABLE 1, provided below, are used to discuss the voltages that are used to program, erase, and read the contents of the EEPROM cells taught in FIGS. 2 through 10.

TABLE 1

| Memory Operation | Cell Selection Type | Horizontal Control Voltage Applied | Vertical Control Voltage Applied | Drain Voltage Applied | Source Voltage Applied | Bulk Voltage Applied | Resulting Tunnel Oxide Voltage (Erased Cell) | Resulting Tunnel Oxide Voltage (Programmed Cell) |
|---|---|---|---|---|---|---|---|---|
| Program Bit | Selected Cell | −7 Volts | −7 Volts | 3.6 Volts | 3.6 Volts | 0 Volts | 12.6 Volts | 9.2 Volts |
|  | Unselected Bit | −7 Volts | 11 Volts | 3.6 Volts | 3.6 Volts | 0 Volts | 5.4 Volts | 2.0 Volts |
|  | Unselected Row | 11 Volts | −7 Volts | 3.6 Volts | 3.6 Volts | 0 Volts | 5.4 Volts | 2.0 Volts |
|  | Unselected Both | 11 Volts | 11 Volts | 3.6 Volts | 3.6 Volts | 0 Volts | −1.8 Volts | −5.2 Volts |
| Erase Bit | Selected Cell | 11 Volts | 11 Volts | 0 Volts | −3.6 Volts | −3.6 Volts | −9.0 Volts | −12.4 Volts |
|  | Unselected Bit | 11 Volts | −7 Volts | 0 Volts | −3.6 Volts | −3.6 Volts | −1.8 Volts | −5.2 Volts |
|  | Unselected Row | −7 Volts | 11 Volts | 0 Volts | −3.6 Volts | −3.6 Volts | −1.8 Volts | −5.2 Volts |
|  | Unselected Both | −7 Volts | −7 Volts | 0 Volts | −3.6 Volts | −3.6 Volts | 5.4 Volts | 2.0 Volts |
| Read Bit | Selected Cell | 3.6 Volts | 3.6 Volts | 1.8 Volts | 0 Volts | 0 Volts | 2.32 Volts | −1.08 Volts |
|  | Unselected Bit | 3.6 Volts | 0 Volts | 0 Volts | 0 Volts | 0 Volts | 1.96 Volts | −1.44 Volts |
|  | Unselected Row | 0 Volts | 3.6 Volts | 1.8 Volts | 1.8 Volts | 0 Volts | 3.76 Volts | 0.36 Volts |
|  | Unselected Both | 0 Volts | 0 Volts | 0 Volts | 1.8 Volts | 0 Volts | 5.2 Volts | 0.0 Volts |

The first column of Table 1 indicates the three primary types of operations which are performed on typical floating gate structures. The three primary operations performed on floating gate structures, such as an EEPROM memory cell, is a program operation, an erase operation, and a read operation. For each of these three types of operations there are four different types of cell selection states that will occur within a two-dimensional memory array due to the two-dimensional decoding process. The two-dimensional decoding process occurs by enabling a row control signal along a row of memory cells and enabling a column control signal along a column of memory cells. A "selected" cell or group of "selected" cells at the intersection of these asserted row and column signals are selected for the designated read, erase, or program operation. This decoding scheme is referred to as a horizontal-vertical decoding scheme or column-row decoding scheme. Due to this two-dimensional row and column decoding scheme, the memory cells which are exposed to an asserted selected row control voltage and an asserted selected column control voltage are "selected" to perform the program, erase or read operation and are referred to as the "selected" cell in a second column of TABLE 1.

Other unselected cells (i.e., all those cells not "selected") within the memory array fall within one of the other three categories listed as "unselected bit", "unselected row", or "unselected both" in column 2 of TABLE 1. Some cells within the array will be exposed to an asserted row control signal while also being exposed to a deasserted column control voltage whereby these cells are "unselected bit" or "unselected column" cells that will not undergo the desired operation (e.g., one of either read, write, or erase). Yet other cells will be exposed to an asserted column control signal but a deasserted row control signal whereby these cells are "unselected row" cells that will not undergo the desired operation (e.g., one of either read, write, or erase). A largest plurality of array cells within the physical EEPROM array will be provided with deasserted row control signals and deasserted column control signals whereby these majority of "unselected" cells are termed "unselected both" cells in TABLE 1.

Therefore, the second column of TABLE 1 indicates which one of the four different types of selection are addressed via the voltage quantities in columns three through nine of TABLE 1. In summary, the four types of bit cell selections which occur in a two-dimensional decoding scheme are (1) the "selected" cell which has both row and column selection enabled, (2) the "unselected bit" cell or "unselected column" cell which has an asserted row signal but an deasserted column signal, (3) an "unselected row" cell which has an asserted column control signal but an deasserted row control signal, and (4) an "unselected both" cell which has both a deasserted column control signal and a deasserted row control signal.

The third through seventh column of TABLE 1 indicates the voltages which are applied to the horizontal control electrode, the vertical control electrode, the drain electrode, the common source, and the bulk of the various bit cells identified in columns one and two. The last two columns of TABLE 1 indicate the tunnel oxide voltage which result in cells that are in a static erased state or a static programmed state within the memory array.

TABLE 1 indicates that for a program operation (see col. 1 of TABLE 1) the "selected" bit or bits within the array receive −7.0 volts at the horizontal control electrode and −7.0 volts on the vertical control electrode. When performing a program operation, an "unselected bit" EEPROM memory cell receives a horizontal control electrode voltage of −7.0 volts and a vertical control electrode voltage of 11.0 volts. TABLE 1 indicates that, when performing program operation, a "unselected row" memory cell receives a 11.0 volt signal on the horizontal control electrode and an −7.0 volt signal on the vertical control electrode. Finally, when performing a program operation, "unselected both" EEPROM memory cells which lie in both an unselected row and unselected column will receive 11.0 volts at both the horizontal control gate and the vertical control gate. As indicated in TABLE 1, all of the drain electrodes and source electrodes of all of the transistors in the memory array are set to 3.6 volts for programming operations. In addition, during a program operation, all transistors in the array have a bulk contact which is set to 0.0 volts.

As can clearly be see from the program rows of TABLE 1, the only memory cells which receive both −7.0 voltage on the horizontal control electrode and −7.0 voltage on the vertical control electrode are the "selected" bits. These two-dimensionally "selected" bits will perform a EEPROM program operation whereas the "unselected bits", the "unselected rows", and "unselected both" EEPROM cells will not be affected by the program operation on the "selected" cell(s). This fact is clearly indicated by the resulting voltages in the last two columns of TABLE 1. The last two columns clearly indicate that the voltages 12.6 volts and 9.2 volts are adequate in "selected cells" to perform the required program operation. However, the 5.4 volts and 2.0 volts of the "unselected bits" and "unselected rows" of TABLE 1 are insufficient to enable electron tunneling in order to program the floating gates of these cells. Furthermore, the "unselected both" cells which obtain −1.8 and −5.2 volts, respectively, for erased and programmed cells will be unaffected by tunneling.

The erase rows of TABLE 1 indicates the voltages which are used to enable an erase operation of selected split-control-gate EEPROM memory cells. The four type of cells referred to as "selected", "unselected bit", "unselected row", and "unselected both" memory cells are graphically illustrated in FIG. 11 herein for an erase operation. As can be seen from the erase rows of TABLE 1 and FIG. 11, a selected bit which is to perform an erase operation is provided with a horizontal and vertical control electrode voltage of 11.0 volts. Therefore, cell 220 in FIG. 11 is a "selected" bit as discussed herein. An "unselected bit" or "unselected column" memory cell is illustrated via transistor 222 of FIG. 11. This cell receives a vertical control voltage of −7.0 and a horizontal control voltage of 11.0 volts as indicated in TABLE 1. An "unselected row" memory cell is illustrated via transistor 224 of FIG. 11. This cell 224 receives a horizontal control gate voltage of −7.0 volts and a vertical control gate voltage of 11.0 volts as indicated via TABLE 1. Cell 226 of FIG. 11 is an "unselected both" cell since the horizontal control gate voltage and the vertical control gate voltage are both deselected or deasserted to the −7.0 volt level required for erase operations (see TABLE 1). For the entire memory array, all drain electrodes are set to 0.0 volts for erase operations as indicated in TABLE 1 hereinabove. All source electrodes within the memory array are placed at −3.6 volts as indicated via TABLE 1 herein for an erase operation. In addition, all bulk connections within the memory array are placed at −3.6 volts for the duration of the erase operation. As can be seen in the last two columns of TABLE 1, only cell 220 of FIG. 11 and like "selected" cells have enough voltage of −12.4 volts to enable erasing via electron tunneling. All the "unselected columns", "unselected rows" and "unselected both" memory cells do not have the proper voltages in the last two columns of TABLE 1 to enable any type of erase tunneling operations.

After explaining the program and erase operations, the read operation is relatively straight-forward. TABLE 1 clearly indicates that read "selected" cells are determined using a two-dimensional column/row decoding involving voltages less than $V_{DD}$ on both the horizontal and vertical control electrodes. However, the use of the 1.8 volt signals used in the read operation may require some explanation. The 1.8 volt signals applied, for example, to the source electrodes for read operations in TABLE 1 are used to turn off unselected rows during a read in the event that there is no select transistors in the array thereby avoiding adverse current drawn from or provided to unselected rows. Therefore, only the "selected" cells are read whereas all other "unselected" cells in the memory arrays do not have proper voltages which enable read operations from the memory array.

It is important to note that TABLE 1 indicates that the drain voltage is never required, under any operation or decoding, to be elevated above $V_{DD}$. Therefore, the split-control-gate EEPROM cell taught herein allows lower voltage transistors to be used as column select circuits and drain connections within the EEPROM memory array. This lower drain voltage also reduces loss of charge due to drain stress. The only high voltages occurring within the memory cells of FIGS. 2 through 11 are the voltages which occur on the vertical and horizontal control gates. Therefore, this split gate decoding scheme separates the high voltage signals from the read signals in an advantageous manner. As indicated by TABLE 1, the maximum stress voltage across a tunnel oxide which is "unselected" in TABLE 1 is 5.4 volts. This is 7.0 volts less than the maximum program/erase voltage of −12.4 volts. Therefore, this 7.0 volt safety margin is safely in excess of the routinely-accepted 5.0 volt safety requirement which is used in most conventional EEPROM cells. Due to this 7.0 volt safety window, no cells which are "unselected" will suffer any significant reduction or increase in floating gate stored charge. Too much altering of charge in "unselected" gates results in the failure or corruption of the stored logic values over time.

Figure 12:
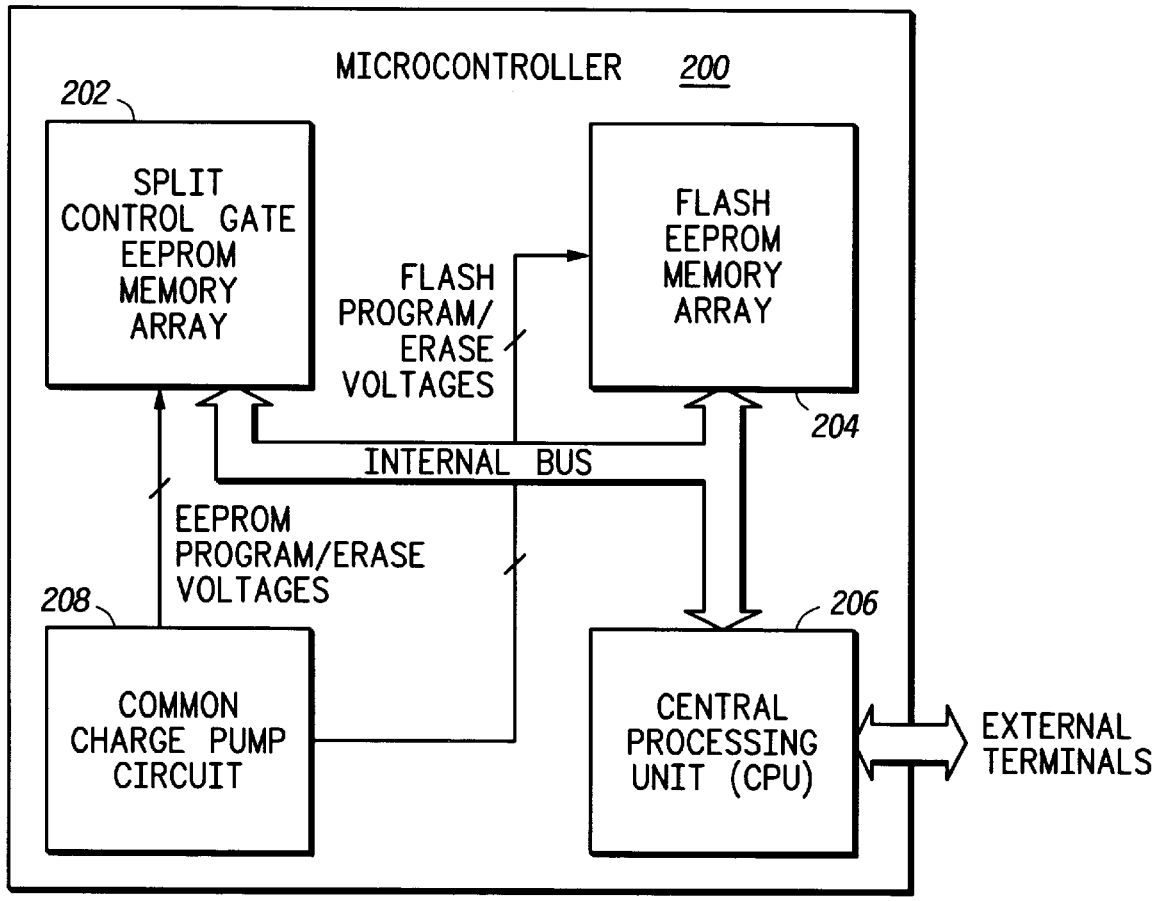
FIG. 12 illustrates, in a block diagram, a microcontroller which contains both flash and split-control-gate EEPROM memory arrays coupled to a common charge pump in accordance with the present invention.

Another advantage of the split gate EEPROM cell is illustrated in FIG. 12. The voltages obtained in TABLE 1 in FIG. 11 herein enable the EEPROM cell of FIGS. 2 through 10 to be integrated on-chip with flash EEPROM devices. Unlike previous circuits which required that the EEPROM memory be supplied with a first on-chip charge pump and the flash EEPROM memory be supplied with a second on-chip charge pump, the voltages of TABLE 1 allow the split-control-gate EEPROM memory of FIGS. 2 through 10 to be supplied from the same charge pump which is used to supply voltages to the flash memory array. Since charge pumps consume a significant amount of silicon substrate surface area, this compression of two separate charge pump circuits into a single charge pump circuit is very advantageous an embedded microcontroller design and flash/EEPROM integrated chips.

Accordingly, FIG. 12 illustrates a microcontroller 200. This microcontroller contains a central processing unit (CPU) 206 which interfaces, via an internal bus, to flash EEPROM memory array 204 and a split-control-gate EEPROM memory array 202 formed in accordance with the teachings of FIGS. 2 through 11. Since the array 202 can be programmed, erased, and read given the voltages of TABLE 1, a single common charge pump circuit 208 can be used to provide both EEPROM program and erase voltages and flash program and erase voltages as illustrated in FIG. 12. Since the high voltages in the split-control-gate cells taught herein are only applied to gate electrodes and not current electrodes (e.g., drain electrodes), the current drawn from the charge pump is low. This further allows the charge pump 208 to be designed in a smaller surface area since less current is required to be sourced by the charge pump 208.

While the present invention has been illustrated and described with reference to specific embodiments, further modifications and improvements will occur to those skilled in the art. For example, the voltages illustrated in TABLE 1 can be reversed in polarity while still rendering a functional device which has complementary erased and programmed states. In addition, the voltages in TABLE 1 can be slightly altered while still obtaining a result similar to that taught herein. The coupling ratio between the control gates and the floating gate need not be equal and can be altered. Three or more control gates may be used to perform more complex decoding than a two-dimensional decode. It is to be understood, therefore, that this invention is not limited to the particular illustrations and that it is intended in the appended claims to cover all modifications that do not depart from the spirit and scope of this invention.

What is claimed is:

1. A floating gate memory device comprising:
   a floating gate EEPROM cell formed on a substrate and having a current electrode;
   a flash memory cell formed on the substrate and having a current electrode; and
   a charge pump coupled to both the current electrode of the flash memory cell and the current electrode of the floating gate EEPROM cell, the charge pump selectively supplying charge to both the flash memory cell and the floating gate EEPROM cell to enable programming and erasing of both the flash memory cell and the floating gate EEPROM cell wherein a voltage applied to both a source electrode and a drain electrode of the floating gate EEPROM cell does not exceed 5.0 volts for both the programming and erasing of the EEPROM cell.

2. The floating gate memory device of claim 1 wherein the charge pump supplies a drain voltage of X to the flash memory cell and a drain voltage of Y to the floating gate EEPROM cell wherein X>Y.

3. The floating gate memory device of claim 1 wherein a voltage applied to both a source and drain current electrode of the floating gate EEPROM cell does not exceed 4.0 volts in absolute value for both the programming and erasing of the EEPROM cell.

4. The floating gate memory device of claim 1 wherein the EEPROM cell has two control gates wherein a voltage applied to either control gate never exceeds 11.0 volts in absolute value.

5. A floating gate transistor structure comprising:
   a substrate comprising silicon;
   a tunnel oxide less than 100 Angstroms in thickness formed over the substrate;
   a U-shaped floating gate which is U-shaped when viewed from a top perspective view, the U-shaped floating gate overlying the tunnel oxide wherein the U-shaped floating gate comprises silicon;
   an inter-level dielectric layer overlying the U-shaped floating gate wherein the inter-level dielectric layer contains a nitride layer and an oxide layer;
   a first control gate overlying the inter-level dielectric layer and being capacitively coupled to a first portion of the U-shaped floating gate;
   a second control gate overlying the inter-level dielectric layer, being laterally separated from the first control gate whereby no portion of the second control gate directly overlies a portion of the first control gate, and being capacitively coupled to a second portion of the U-shaped floating gate wherein the first portion is different from the second portion.

6. The floating gate transistor of claim 5 wherein a select transistor is coupled to the floating gate transistor wherein the select transistor is adapted to selectively control access to the floating gate transistor.

7. A floating gate memory device comprising:
   a floating gate EEPROM cell formed on a substrate and having a current electrode, the floating gate EEPROM cell comprising:
      a drain electrode coupled to a bit line;
      a source electrode coupled to a source conductor;

a channel region located between the source electrode and the drain electrode;

a floating gate electrode adjacent the channel region;

a first control electrode overlying and adjacent the floating gate electrode, the first control electrode being coupled to a horizontal select control signal; and a second control electrode overlying and adjacent the floating gate electrode, the second control electrode being coupled to a vertical select control signal, whereby the floating gate transistor is either programmed or erased only when both the first and second control electrodes are enabled;

a flash memory cell formed on the substrate and having a current electrode; and a charge pump coupled to both the current electrode of the flash memory cell and the current electrode of the floating gate EEPROM cell, the charge pump selectively supplying charge to both the flash memory cell and the floating gate EEPROM cell to enable programming and erasing of both the flash memory cell and the floating gate EEPROM cell wherein a voltage applied to the current electrode of the floating gate EEPROM cell does not exceed 5.0 volts.

8. The floating gate memory device of claim 7 wherein the flash memory cell and the EEPROM cell are both coupled to a central processing unit (CPU) where all of the CPU, flash memory cell, and the EEPROM cell are located on a contiguous silicon substrate.

* * * * *